Dec. 29, 1964 R. A. LEIGHTNER 3,163,779

PULSE DIVIDER EMPLOYING THRESHOLD DEVICE TRIGGERED
BY COINCIDENCE OF TRYOUT PULSES AND
SYNCHRONIZED RC-DELAYED PULSES
Filed June 21, 1962

INVENTOR.
ROBERT A. LEIGHTNER
BY Paul D. Carmichael
ATTORNEY 3,163,779

PULSE DIVIDER EMPLOYING THRESHOLD DEVICE TRIGGERED BY COINCIDENCE OF TRY-OUT PULSES AND SYNCHRONIZED RC-DELAYED PULSES

Robert A. Leightner, Tioga Center, N.Y., assignor to International Business Machines Corporation, New York, N.Y., a corporation of New York Filed June 21, 1962, Ser. No. 204,262
11 Claims. (Cl. 307—88.5)

The present invention relates generally to the electronic arts and more particularly to the provision of an improved regenerative circuit. As used herein, a regenerative circuit is defined as a circuit whose operation is at least partially responsive to the signal in the output portion thereof.

In many applications, such as in the digital computing arts, it is necessary to provide accurately timed output signals. For example, it may be desirable to generate an output pulse of preselected duration each time a preselected number of input pulses have been supplied thereto. The output pulse can last for a time interval less than or greater than the time period separating two of the input signals. Such circuits are commonly referred to as pulse rate dividers, counters or scaling circuits in that the frequency of the output signals is a submultiple of the frequency of the input signal. Alternately, a circuit may be required which is free running in the sense that the same generates an accurate pulse train output in the absence of input signals.

In the applications above described, it is conventional to use blocking oscillators and multivibrators, which circuits are well known in the art. When a blocking oscillator is employed as a pulse rate divider or counter, the input pulses are superimposed directly on an exponentially rising signal so that an electric valve is fired when the resultant signal reaches or exceeds a predetermined firing level to produce an output pulse. Although widely employed, such a blocking oscillator is somewhat unreliable in certain applications—i.e., where a large pulse rate division is being accomplished since the exponentially rising signal is at a level which is quite close to the predetermined firing level for an extended period of time. This condition may cause output pulses to occur at times other than the desired times due to the presence of noise or other spurious signals. Such variations are usually cumulative over long operating periods. The above limitation also characterizes multivibrators whose active elements are triggered in response to an exponentially rising signal.

The operation of such circuits is adversely affected by changes in environmental conditions, such as temperature, and this is particularly true when transistors are employed. This often necessitates the provision of complicated compensating networks. Further, these circuits are characterized by their many and expensive component parts.

Briefly, the present invention relates to a regenerative circuit having an input terminal and an output terminal. The circuit comprises an electric valve which in one state appears as a high impedance circuit element and in the other state appears as a low impedance circuit element, such as a three terminal, four layer semiconductor device. The electric valve has a means to control the state thereof which is connected via an energy responsive switch means, such as a Zener diode, to a potential source. Energy is supplied from the source to an energy storage element and, after a preselected time interval, the energy responsive switch means is energized so that the control means of the electric valve is effectively connected to the potential source. The valve switches to its low impedance state very quickly after energization of the switch means when the threshold or firing level thereof is exceeded. A discharge circuit comprising the conducting electric valve is provided for the energy storage element. The rate of discharge of the energy storage device is controlled to provide the desired output. The circuit can be in a quiescent state in the absence of input pulses or free running, depending upon the particular application therefor.

It is the primary or ultimate object of the present invention to provide a regenerative circuit wherein the control means of a electric valve, such as the base of a three terminal, four layer semiconductor device, is raised in a very short time interval from a level substantially below to a level above the threshold or firing level when an output signal is to be provided. This is accomplished by employing a level responsive switch, a Zener diode, for example, to isolate the control means of the electric valve from a potential source until a predetermined quantity of energy has been accumulated by an energy storage element. When the switch is energized, the level change on the control means is quite substantial and takes place in a very short time interval to provide the desired output. The operation of the circuit is not adversely affected by noise and other spurious signals or changes in environmental conditions.

Another object of the invention is to provide a regenerative circuit of the type set forth above which is reliable in operation over long operating periods and is highly simplified in construction and operation. In the disclosed embodiment of the invention, the circuit comprises a single three terminal, four layer semiconductor device, a Zener diode, a capacitor and various biasing circuit elements. The three terminal, four layer semiconductor device is particularly well adapted for use in this application since this device supplies its own internal controlling current and is rendered fully conductive once the threshold or firing level thereof has been exceeded.

A further object of the invention is the provision of a regenerative circuit having the above characteristics which is extremely versatile. The circuit can be employed as a pulse rate divider, a scaling circuit or a counter in that an output pulse is provided only after the occurrence of a preselected number of input pulses. Alternately, the circuit may be free running to provide accurately timed output pulses without external stimulation of input signals. The duration of the output pulse can be accurately selected and controlled so that the circuit may be used as a source of gating or timing pulses.

The foregoing and other objects, features and advantages of the invention will be apparent from the following more particular description of preferred embodiments of the invention as illustrated in the accompanying drawings.

Figure 1:
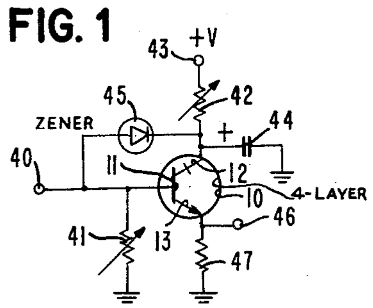
FIGURE 1 is a schematic circuit diagram of a regenerative circuit constructed and operated in accordance with the teachings of the present invention.

Referring now to the drawings and initially to FIGURES 1–5 thereof, there is shown a regenerative circuit constructed and operated in accordance with the teachings of the present invention. The circuit has as its active element a four-layer semiconductor device 10 having a base electrode 11, a collector electrode 12 and an emitter electrode 13. The semiconductor device 10 is a PNPN type electric valve which in one state appears as a high impedance circuit element and in the other state appears as a low impedance circuit element when employed in the circuit herein described.

Figure 2:
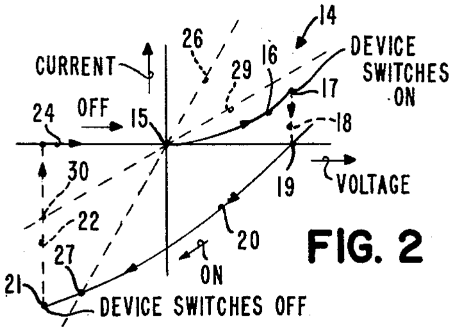
FIGURE 2 illustrates graphically the volt-ampere characteristics of the base to emitter junction of a typical three terminal, four-layer semiconductor device.

The graphical presentation of FIGURE 2 of the drawings illustrates the current versus voltage characteristic curve 14 of the base 11 to emitter 13 junction of the three terminal, four-layer semiconductor device 10 when the input to the base is varied. Assuming that the semiconductor device is initially in its off state as represented by point 15 on the curve 14, the base current and voltage are zero. As the base voltage is increased, the base current rises in a non-linear manner along curve portion 16 until point 17 is reached. At point 17 the input current and voltage are sufficient to change the state of the semiconductor device and the current drops along transition portion 18 to point 19. The transition portion of curve 14 is due partially to the semiconductor device supplying its own input current through redistribution of its internal minority carriers. Once the threshold or firing voltage (as represented by point 17) has been exceeded, the semiconductor device is rendered fully conductive and appears as a low impedance circuit element across the collector 12 and the emitter 13 thereof. The ability of the semiconductor device to supply its own current internally to complete switching one the threshold or firing voltage has been exceeded is particularly important in accomplishing the objects of the present invention as will be hereinafter more fully explained.

A gradual reduction in the base voltage causes the base current to decrease as represented by portion 20 of the curve 14 until point 21 is reached. At point 21 the input current is sufficiently negative to overcome and cancel out the input current supplied by the device itself and the semiconductor device switches along transition portion 22 until point 23 is reached. The base-to-emitter junction is back biased and the semiconductor device appears as a high impedance circuit element across the collector 12 and emitter 13 thereof. An increase in the base voltage will cause the semiconductor device to return along portion 24 to the initial assumed starting condition as represented by point 15 on the curve.

The semiconductor device can be operated as either a monostable or a bistable switching device, depending on the effective impedance in the base circuit thereof. If an effective base impedance is chosen to provide a load line which intersects the characteristic curve at points on both the OFF (portions 24 and 16) and ON (portion 20) parts thereof, the semiconductor device will have two stable states. This is represented by load line 26 which passes through point 15 and intersects portion 20 at point 27. When the base current and voltage are zero, the semiconductor device is non-conducting and in one stable state. An increase in the base voltage which exceeds the threshold or firing voltage (point 17) will cause the semiconductor device to switch to point 27 which represents the second stable state. The base voltage must be further decreased to return the semiconductor device to its first and non-conducting stable state.

If the effective base impedance is reduced to provide load line 29, the semiconductor device will have only one stable operating state as represented by point 15. The other crossover point 30 between the load line 29 and curve 14 represents an unstable condition since it lies along transition portion 22. Once the threshold or firing voltage (point 17) has been exceeded, the semiconductor device will quickly traverse portion 20 of curve 14 and return to its high impedance state at point 15. The specific slope of a load line for a four-layer semiconductor device is determined by the particular device itself and its associated circuit parameters.

Figure 3:
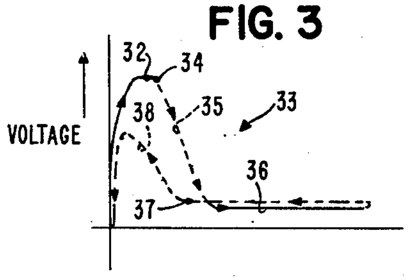
FIGURE 3 is a graph showing collector current with respect to collector voltage for a typical three terminal, four-layer semiconductor device.

In FIGURE 3 of the drawings, there is shown a graphical illustration of collector current versus collector voltage for a typical four-layer semiconductor device. This curve is obtained by increasing and then decreasing the collector supply voltage which is connected in series with a current limiting resistor while the base electrode is open circuited. As the collector supply voltage is increased from zero, the collector voltage rises sharply along portion 32 of curve 33 until point 34 is reached. A further increase in collector supply voltage causes the operating point of the semiconductor device to switch along transition portion 35 of the curve. The semiconductor device is now in its low impedance state as represented by curve portion 36. Decreasing the collector supply voltage causes the operating point to move back along portion 36 until point 37 is reached. The point 37 defines the critical value of the collector current which is required to maintain the semiconductor device in its low impedance state. The semiconductor device switches along transition portion 38 and then traverses the lower part of portion 32 as the collector supply voltage is reduced to zero. The device is now in its other or high impedance state.

It will be noted that the device may be switched from its low impedance to its high impedance state either by reducing the collector current below the critical value (point 37) or decreasing the base voltage to a value below the transition point 21. The collector voltage must exceed that defined by transition point 34 and the base voltage must exceed the threshold or firing voltage indicated by transition point 17 for the semiconductor device to be switched to its conducting and low impedance state. A further description of a three terminal, four-layer semiconductor device is presented at pages 71–73 of the book entitled "Transistor Physics and Circuits" by R. L. Riddle and M. P. Ristenbatt which was published in 1958 by Prentice-Hall, Inc., Englewood Cliffs, New Jersey.

Returning now to FIGURE 1 of the drawings, the base electrode 11 of the semiconductor device is connected to an input terminal 40 and also to ground via a variable base resistor 41. The collector 12 is connected in series with a variable collector resistor 42 to a positive terminal 43 of a direct current voltage source, not shown. The collector is connected to one side of a capacitor 44 whose other side is referenced to ground. A Zener diode 45 has its anode connected to the collector 12 while the cathode thereof is referenced to the base 11 of the semiconductor device. The capacitor 44 defines an energy storage device while the Zener diode 45 acts like a voltage responsive switch for alternately effectively connecting and isolating the potential at terminal 43 with respect to the base 11. An output signal is taken directly from the emitter 13 of the semiconductor device via an output terminal 46. This latter electrode of the semiconductor device is referenced to ground through an emitter resistor 47. The variable resistors 41 and 42 provide means for adjusting the effective impedances at various points in the circuit and the settings thereof determine the particular type of operation of the circuit. It is contemplated that these resistors will be adjusted initially to define the type of operation desired for a given application. Alternately, the variable resistors may be replaced with circuit elements having fixed impedance values where only one type of operation is required.

In describing the operation of the circuit, it will be assumed initially that the semiconductor device 10 is in its high impedance state and an input pulse train 49 (see FIGURE 4 of the drawings) having a predetermined pulse repetition rate is applied to input terminal 40 and base electrode 11. The individual input pulses which are present on the base of the semiconductor device do not exceed the threshold or firing level (point 17) of the device and the same remains in its high impedance state. No change in the output signal at output terminal 46 is observed at this time.

The capacitor 44 is being charged from the source of direct current voltage at a rate controlled by the time constant of the charging circuit which comprises the series connected variable collector resistor 42 and the capacitor 44. The left hand terminal of capacitor 44 is at a positive voltage value as represented by the plus sign in FIGURE 1 of the drawings. The capacitor 44 is also in a series circuit comprising the Zener diode 45 and the base resistor 41 so that the voltage on the capacitor is impressed across the Zener diode 45 and the base resistor 41. As is well known, a Zener diode is effectively a high impedance device until the breakdown voltage of the same has been exceeded. The Zener diode then appears as a circuit impedance element having a constant voltage drop equal to the breakdown voltage thereof.

After a preselected time interval, dependent upon the time constant of the charging circuit for capacitor 44 and the characteristics of the Zener diode 45, the voltage on the capacitor 44 exceeds the breakdown voltage of Zener diode 45. The base 11 of the semiconductor device is effectively connected to the terminal 43 and the voltage on the base rises at a very fast rate. The voltage on base 11 rises at the same rate as the voltage on collector 12. This is represented by portion 50 of the curve depicting the voltage on the base of the semiconductor device.

Figure 4:
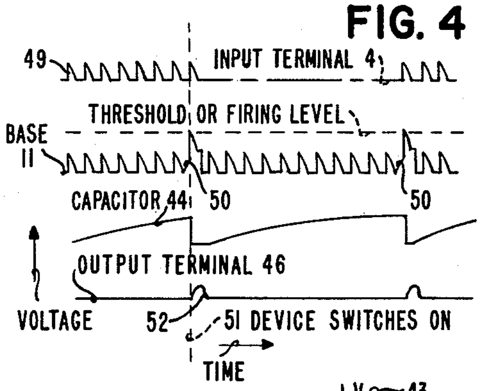
FIGURE 4 is a series of graphs showing the electrical signals at various points in the circuit of FIGURE 1 with respect to time for one mode of operation thereof.

The next input pulse is added to the voltage on the base electrode 11 and the resultant signal exceeds the threshold or firing level of the semiconductor device so that the same is immediately rendered conductive at the time represented by broken line 51 in FIGURE 4 of the drawing. The semiconductor device immediately switches and now appears as a low impedance circuit element. Since the semiconductor device supplies a portion of its own input current, the same will switch completely regardless of the duration of the input pulse once the threshold or firing level thereof has been exceeded.

A discharge path comprising the conducting semiconductor device 10 and emitter resistor 47 is completed for the capacitor 44. The charge on the capacitor is dissipated and produces an output pulse 52 at the output terminal 46. When the collector current of the semiconductor device drops to a value below the value of the critical collector current (point 37), the semiconductor device switches back to its high impedance state. The circuit is again ready for another cycle of operation and capacitor 44 begins to charge to the value of the voltage at terminal 43.

The voltage curves presented in FIGURE 4 of the drawings depict the operation of the circuit where a single output signal is produced after a preselected number of input pulses have been supplied to the base of the semiconductor device. The time constant of the charging circuit for the capacitor 44 and the breakdown characteristic of the Zener diode 45 are such that the breakdown voltage of the Zener diode is not exceeded until immediately after the occurrence of the preselected number of input pulses. The resistor 47 is selected so that the voltage on capacitor 44 will be discharged in a time interval which is less than the time separation of two of the input pulses. In this mode of operation, the circuit acts as a pulse rate divider or counter in that an output pulse occurs at terminal 46 each time a preselected number of input pulses have been supplied to the base of the semiconductor device. In a constructed embodiment of the invention, the following circuit elements and values were employed in providing a pulse rate division of three where the frequency of the input signals was three kilocycles:

| | |
|---|---|
| Semiconductor device **10** | Type 3N56. |
| Zener diode **45** | Type IN653. |
| Collector resistor **42** | 12,000 ohms. |
| Capacitor **44** | 0.075 micro farads. |
| Emitter resistor **47** | 4.4 ohms. |
| Base resistor **41** | 3000 ohms. |
| Terminal **43** | +12 volts. |

In order to change the division rate, it is only necessary to adjust the time constant of the charging circuit for capacitor 44. This can be accomplished by replacing capacitor 44, adjusting collector resistor 42 or a combination of these. To produce a pulse rate division of five in the above-constructed embodiment of the invention, the capacitor was replaced with a capacitor having a value of 0.125 microfarad.

It will be observed that the voltage at the base of the semiconductor device rises to a level where the next input pulse will trigger the semiconductor device only after the Zener diode 45 has been energized. At all other times, the voltage on the base is far below the threshold or firing level. This offers advantages over conventional circuits for a similar purpose where the input pulses are superimposed directly on an exponentially rising signal. If the pulse rate division is relatively large, the resultant pulses occurring immediately prior to the time an output signal is desired are substantially the same peak voltage amplitude. This condition makes reliable operation of such circuits extremely difficult and imposes stringent limitations on the circuit components. These limitations are completely avoided in the circuit of the present invention.

The circuit of FIGURE 1 of the drawings can be employed to generate output pulses only in the presence of input pulses. This is accomplished by adjusting the base resistor 41 to a value such that an input pulse is required to raise the voltage on the base above the threshold or firing level. Such operation is desirable in certain applications and the output pulses are always synchronized with the input pulses. Alternately, the circuit can be employed as a free-running pulse generator by increasing the impedance in the base circuit of the semiconductor device. The base resistor 41 is adjusted to provide a higher resistance value so that when the breakdown voltage of the Zener diode 45 is exceeded, the voltage on the base quickly rises to the threshold level of the semiconductor device. The rise of the base voltage in this mode of operation is shown at 56 in FIGURE 5 of the drawings.

The semiconductor device is immediately rendered conductive and the capacitor 44 discharges through the semiconductor device and the emitter resistor 47. This causes an output pulse 58 to appear at the output terminal 46. Eventually, the collector current of the semiconductor device falls below the critical collector current value and the semiconductor device switches to its high impedance state. The capacitor 44 again begins to charge toward the voltage at terminal 43. The frequency of the pulse train output is primarily dependent upon and controllable by adjusting the time constant of the charging circuit for capacitor 44. This mode of operation may be employed where accurately timed pulse outputs are required.

Figure 6:
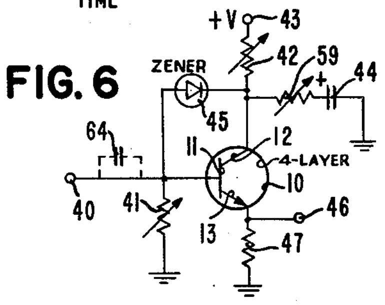
FIGURE 6 is a schematic circuit diagram of another regenerative circuit embodying the teachings of this invention.

In FIGURE 6 of the drawings, there is shown another embodiment constrmucted in accordance with the teachings of this invention. To avoid repetition in the specification, like reference numerals have been used for components similar to those employed in connection with the circuit of FIGURE 1 of the drawings. It is noted that a variable resistor 59 is connected in series with the capacitor 44 and the collector 12 of the semiconductor device 10.

Figure 7:
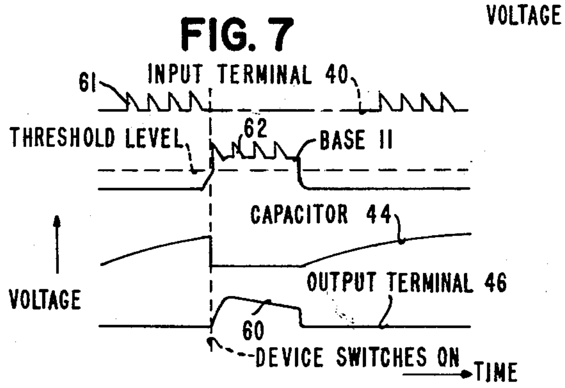
FIGURE 7 is a series of curves illustrating the electrical signals apearing at various points in the circuit of FIGURE 6 with respect to time for one mode of operation thereof.

In the previously described embodiments of the invention, the voltage on capacitor 44 has been discharged very quickly when the semiconductor device is switched to its low impedance state. The rate at which the charge on capacitor 44 is dissipated controls the time at which the semiconductor device is returned to its high impedance state since this determines when the collector current has diminished to a value below the critical collector current value as indicated at point 37 in FIGURE 3 of the drawings. By changing the time constant of the discharge path, as for example, by adjusting the value of variable resistor 59, the time duration of the output signal can be controlled. For example, in FIGURE 7 of the drawings, there is shown a series of curves for a setting of variable resistor 59 which produces output pulses 60 that extend for a time interval slightly greater than the period of four of the input pulses 61. The signal 62 on the base of the semiconductor device is raised above the threshold or firing level during substantial portions of the output pulses 60 so that the same would provide such output signals even in the absence of the input pulses 61. However, in accordance with the above teachings, a circuit can be provided which will provide an output signal of controlled time duration only in the presence of input pulses. This mode of operation is particularly useful in generating periodic gating signals for use in a digital computer, for example.

Figure 8:
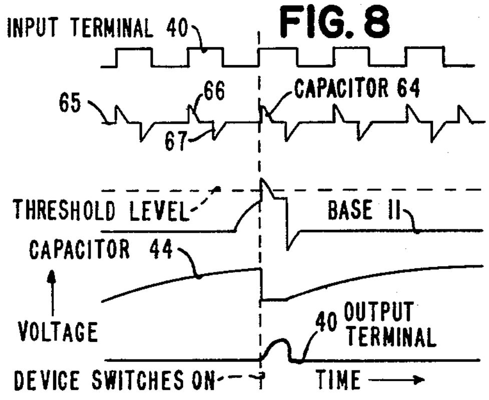
FIGURE 8 is a graphical presentation of signals occurring at points in the circuit of FIGURE 6 with respect to time for a second mode of operation thereof.
Figure 5:
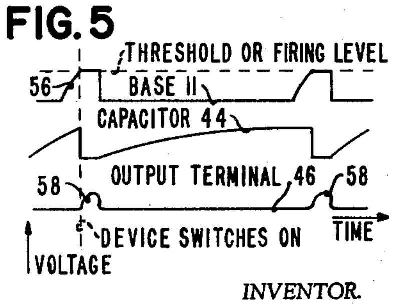
FIGURE 5 is a series of graphs showing the electrical signals at various points in the circuit of FIGURE 1 with respect to time when a second mode of operation is employed.

In all of the above embodiments, the semiconductor device is switched to its high impedance state when the collector current falls below the value of the critical collector current. As previously explained, the semiconductor device will also switch to its high impedance state when the base voltage is reduced below the voltage represented by transition point 21 in FIGURE 2 of the drawings. The semiconductor device can be switched to its high impedance state by inserting a differentiating device, such as capacitor 64, between the input terminal 40 and the base of semiconductor device. The operation of the capacitor 64 is shown in FIGURE 8 of the drawings wherein the output of the capacitor is shown at 65 and comprises a positive pulse 66 which is immediately followed by a negative pulse 67. When the voltage on capacitor 44 exceeds the breakdown potential of the Zener diode 45, the signal on the base of the semiconductor device rises rapidly at substantially the same rate as the rise in voltage at the collector. The next input pulse causes the semiconductor device to switch to its low impedance state. The negative going pulse 67 associated with this input pulse will reduce the voltage on the base of the semiconductor device below the critical base voltage as represented by point 21 in FIGURE 2 of the drawings. The semiconductor device will switch to its high impedance state. The arrangement is such that the duration of the output pulse is accurately regulated to the time interval between a positive pulse 66 and the following negative pulse 67 supplied by capacitor 64. The same mode of operation could be obtained by disconnecting the capacitor 64 and employing bipolar input pulses.

In all of the above-mentioned modes of operation, the circuit is characterized by its highly reliable operation and extreme simplicity. Greatly improved temperature stability is provided since the period of the output pulses is independent of the transistor beta. The effect of variations in the level of the semiconductor device due to temperature changes is cancelled by similar temperature dependence of the breakdown level of the Zener diode. The circuit employs a minimum of components and does not require a pulse transformer whereby the same is ideally adapted to microminiature packaging techniques.

It should now be apparent that the objects initially set forth have been accomplished. The regenerative circuit is extremely versatile in that the same may be employed as a source of pulse signals where the frequency of the signals and the duration of each signal can be accurately controlled. The circuit can be responsive to input signals or free running as is best adapted for a given application.

While the invention has been particularly disclosed and described with reference to preferred embodiments thereof, it will be understood by those skilled in the art that the foregoing and other changes in form and details may be made therein without departing from the spirit and scope of the invention.

What is claimed is:

1. A pulse frequency divider producing an output pulse train having a pulse period of $P_2$ from an input pulse train having a pulse period of $P_1$ wherein $P_1$ and $P_2$ are integers denoting units of time, said pulse frequently divider comprising:

an input terminal and an output terminal;

a four layer semiconductor device having a base, an emitter and a collector;

said input terminal being connected with said base of said semiconductor device;

a Zener diode having an anode and a cathode;

the anode of said Zener diode being connected with said base and the cathode of said Zener diode being connected with said collector of said semiconductor device;

an energy storage element connected to said collector of said semiconductor device;

means to supply energy to said energy storage device at a preselected rate so that the energy stored in said energy storage element tends to render said Zener diode conductive after a time interval equal to $NP_1$ where N is an integer;

said preselected rate being such that, when said Zener diode is rendered conductive, the bias on the base of said semiconductor rises rapidly towards the level necessary to change the state of conductivity of said semiconductor said emitter of said semiconductor device being connected with said output terminal; and level setting means for said base of said semiconductor device adjusted so that after said time interval, $NP_1$, an input pulse, combined with said bias on said base, is sufficient to change the state of conductivity of said semiconductor device and thereby produce a pulse at said output terminal.

2. A pulse frequency divider producing an output pulse train having a pulse period of $P_2$ from an input pulse train having a pulse period of $P_1$ wherein $P_1$ and $P_2$ are integers denoting units of time, said pulse frequency divider comprising:

an input terminal and an output terminal;

an electric valve having a pair of terminals and a control means;

said input terminal being connected with said control means;

energy responsive switch means connected between said control means and one of said valve terminals;

an energy storage means connected with said energy responsive switch means and said one of said valve terminals;

means to supply energy to said storage means at a preselected rate so that the energy stored in said energy storage means actuates said switch means after a time interval equal to $NP_1$ where N is an integer;

said preselected rate being such that, when said switch means is actuated, the energy applied to said control means rises rapidly toward the level necessary to render said electric valve conductive; said output terminal being connected with the other of said valve terminals; and said electric valve being rendered conductive after said time interval, $NP_1$ by an input pulse, combined with the rapidly rising energy applied to said control means, so as to produce an output pulse at said output terminal.

3. A regenerative circuit for providing output signals comprising:
- a four-layer semiconductor device having a base, an emitter and a collector;
- said semiconductor device appearing in one state as a high impedance circuit element and in a second state as a low impedance circuit element across said collector and emitter;
- a source of energy connected with said collector;
- a Zener diode having a breakdown level connected between said base and said collector;
- an energy storage element connected with said collector and receiving energy from said source when said semiconductor device is in said one state;
- said energy storage element accumulating sufficient energy from said source to exceed said breakdown level of said Zener diode after a preselected time interval and effectively connect said base with said source;
- an output terminal connected with said emitter;
- an input terminal for receiving an input signal connected with said base of said semiconductor device;
- an impedance in the base circuit of said semiconductor device and connected in series with said source when said breakdown level of said Zener diode has been exceeded;
- said semiconductor device having a base threshold level so that the same switches from said one state to said second state when the signal of the base exceeds said threshold level; and
- said impedance having a value which prevents said threshold level from being exceeded except when an input signal is combined with energy received from said source.

4. A regenerative circuit for providing output signals comprising:
- an electric valve having a pair of terminals and a control means;
- said electric valve appearing in one state as a high impedance circuit element and in a second state as a low impedance circuit element across said terminals;
- said electric valve having a threshold level so that said valve switches from one of said states to the other of said states when the signal on said control means exceeds said threshold level;
- a source of energy connected with one of said terminals;
- an output terminal connected with the other of said terminals;
- an energy responsive switch means connected with said one of said terminals and said control means;
- said energy responsive switch means having a breakdown level;
- an energy storage element connected with said one of said terminals and receiving energy from said source when said electric valve is in one of said states;
- said energy storage element accumulating sufficient energy from said source to exceed said breakdown level of said energy responsive switch means after a preselected time interval and effectively connect said source with said control means;
- an input terminal for receiving an input signal connected with said control means; and
- means limiting the signal supplied to said control means, when said breakdown level of said energy responsive switch means is exceeded, to a level less than said threshold level of said electric valve in the absence of an input signal.

5. Apparatus according to claim 4 wherein said means limiting the signal consists of:
- an impedance means connected in series with said source when said breakdown level of said energy responsive switch means is exceeded; and
- said impedance means having a value which prevents said threshold level from being exceeded except when an input signal is combined with energy received from said source.

6. Apparatus according to claim 4 characterized by:
- a charging circuit for said energy storage element having a time constant and comprising said source; and
- means to change said time constant of said charging circuit.

7. Apparatus according to claim 4 characterized by:
- said electric valve when in said second state providing a discharge path for dissipating the energy accumulated by said energy storage element; and
- said electric value switching from said second state to said first state when the signal across said terminals is insufficient to maintain said valve in said second state.

8. Apparatus according to claim 4 characterized by:
- said discharge path having a time constant; and
- means to change said time constant of said discharge path.

9. A regenerative circuit for providing output signals comprising:
- an electric valve having a pair of terminals and a control means;
- said electric valve appearing in one state as a high impedance circuit element and in a second state as a low impedance circuit element across said terminals;
- an energy storage device;
- a charging circuit for said energy storage device comprising a source of energy;
- said energy storage device accumulating energy from said source when said electric valve is in one of said states;
- energy responsive switch means responsive to the energy stored in said storage device connected between said source and said control means;
- a discharging circuit for said energy storage device when said electric valve is in the other of said states;
- an input terminal for receiving an input signal connected with said control means;
- level setting means connected with said control means; and
- means to change said level setting means and thereby change the level of input signal required to switch said electric valve from said one state to said second state.

10. A circuit for triggering an electric valve comprising:
- an electric valve having a pair of terminals and a control means;
- said electric valve appearing in one state as a high impedance circuit element and in a second state as a low impedance circuit element across said terminals;
- a source of energy;
- energy responsive switch means actuated by bias energy from said source so that said switch means connects the control means of said electric valve with said source of energy when the bias energy exceeds the breakdown energy level of said switch means;
- said electric valve having a threshold level so that, when a signal applied to the control means exceeds the threshold level, said electric valve changes its state;
- energy accumulating means responsive to said source and connected to said energy responsive switch means for accumulating sufficient bias energy to exceed the breakdown energy level of said energy responsive switch means;
- a bias level applied by said switch means to the control means of said electric valve, said bias level changing rapidly toward the threshold level after said switch means is actuated to effectively connect said source with the control means of said electric valve;

level limiting means connected with the control means of said electric valve for limiting the maximum value of said bias level to a level just short of the threshold level;

an input terminal connected with the control means of said electric valve for adding an input signal to said bias level so as to exceed the threshold level and trigger said electric valve into changing states after said energy responsive switch means has been actuated, said input signal being insufficient by itself to exceed the threshold level.

11. Apparatus according to claim 10 characterized by:

said electric valve comprising a four layer semiconductor device; and said energy responsive switch means comprising a Zener diode.

References Cited in the file of this patent

UNITED STATES PATENTS

| | | |
|---|---|---|
| 2,758,250 | Ridler | Aug. 7, 1956 |
| 2,962,663 | Hileman | Nov. 29, 1960 |
| 2,994,784 | White et al. | Aug. 1, 1961 |
| 3,031,621 | Schreiner | Apr. 24, 1962 |

OTHER REFERENCES

Solid State Products Inc., Bulletin D420-09, September 1960, pages 11, 14, 15 and 16.

Wave Generation and Shaping, by Strauss (1960), page 316, McGraw-Hill Book Co., Inc.

UNITED STATES PATENT OFFICE

CERTIFICATE OF CORRECTION

Patent No. 3,163,779 December 29, 1964

Robert A. Leightner

It is hereby certified that error appears in the above numbered patent requiring correction and that the said Letters Patent should read as corrected below.

Column 2, line 11, for "a", first occurrence, read -- an --; column 3, line 42, for "one" read -- once --; column 6, line 70, for "constrmucted" read -- constructed --.

Signed and sealed this 18th day of January 1966.

(SEAL)
Attest:

ERNEST W. SWIDER
Attesting Officer

EDWARD J. BRENNER
Commissioner of Patents